US005491559A

United States Patent [19]

Buechler

[11] Patent Number: 5,491,559

[45] Date of Patent: Feb. 13, 1996

[54] METHOD AND APPARATUS FOR ENGRAVING USING A MAGNETOSTRICTIVE ACTUATOR

[75] Inventor: Lester W. Buechler, Dayton, Ohio

[73] Assignee: Ohio Electronic Engravers, Inc., Dayton, Ohio

[21] Appl. No.: 334,740

[22] Filed: Nov. 4, 1994

[51] Int. Cl.[6] ................................ B41C 102; H01L 41/12

[52] U.S. Cl. ................................ 358/299; 310/26

[58] Field of Search ................................ 310/26; 367/168; 178/6.6 R; 358/296, 299; 346/74

[56] References Cited

U.S. PATENT DOCUMENTS

| | | | |
|---|---|---|---|
| 3,770,888 | 11/1973 | de Vos et al. | 178/66 B |
| 4,308,474 | 12/1981 | Savage et al. | 310/26 |
| 4,609,404 | 9/1986 | Marraccini et al. | 106/288 Q |
| 4,642,802 | 2/1987 | Pozzo et al. | 367/168 |
| 4,770,704 | 9/1988 | Gibson et al. | 75/652 M |
| 4,805,312 | 2/1989 | Datwyler | 33/18.1 |
| 4,818,304 | 4/1989 | Verhoeven et al. | 148/103 |
| 4,849,034 | 7/1989 | Verhoeven et al. | 148/100 |
| 5,039,894 | 8/1991 | Teter et al. | 310/26 |

OTHER PUBLICATIONS

Application Manual for the Design of ETREMA Terfenol–D Magnetostrictive Transducers, 1988.

*Primary Examiner*—Peter S. Wong
*Assistant Examiner*—Eric Frahm
*Attorney, Agent, or Firm*—Jacox, Meckstroh & Jenkins

[57] ABSTRACT

An engraving head apparatus and method for engraving a gravure cylinder. The engraving head apparatus includes a magnetostrictive actuator formed from TERFENOL-D™ which elongatably drives a diamond-tipped stylus arm in a reciprocal manner in response to a varying magnetic field created by a bias coil and a drive coil. The bias coil establishes a DC biasing magnetic field which causes an initial expansion of the actuator to approximately one-half the total linear expansion limit of the actuator. The drive coil is concentrically interposed between the actuator and the bias coil and modulates the magnetic field intensity established by the bias coil to cause additional expansion and contraction of the actuator about the initial expansion point.

61 Claims, 11 Drawing Sheets

B
92
C
30
81
95
92a
86
88
80
80a
82
48
66
90
84
78
76
68
72
70
40b
46
64
50
60
58
52
56
54
40
55
39
58
40a
62
44
96
94
S
42

METHOD AND APPARATUS FOR ENGRAVING USING A MAGNETOSTRICTIVE ACTUATOR

FIELD OF THE INVENTION

This invention relates to an engraver and, more particularly, to an engraver having an engraving head comprising a magnetostrictive actuator for driving a cutting tool or stylus in response to a magnetic field.

BACKGROUND OF THE INVENTION

Some gravure engravers of the past included one or more engraving heads which have a diamond stylus mounted on an arm projecting from a torsionally oscillated actuator shaft. A sine wave driving signal is applied to a pair of opposed electromagnets to rotate the actuator shaft through a maximum arc of approximately 0.25° at a maximum frequency of between 3 to 5 KHz. When torsionally oscillated, the actuator shaft moves the diamond stylus into and out of a copper-plated surface of a gravure cylinder to form or cut holes or cells in the cylinder surface. Gravure cylinders range in size from 6 inches to 15 feet in length, and 4 to 26 inches in diameter. Typically, 20,000 to 50,000 cells per square inch are engraved on a gravure cylinder.

Present engraving heads can produce about 3200 cells per second on the surface of a gravure cylinder when operating at about 3.2 KHz. Thus, the time required to completely engrave a cylinder is typically on the order of hours. The operating frequency for present engraving heads is limited by the mass of the magnetic material used to actuate the stylus. The engraving heads shown and disclosed in U.S. Pat. Nos. 3,964,382 and 4,357,633 show examples of engraving heads and stylus drivers of the type used in the past.

What is needed, therefore, is an engraving head which can move a diamond stylus into and out of a copper-plated surface of a gravure cylinder at a frequency rate greater than present engraving heads, thereby facilitating reducing the time required to engrave a gravure cylinder.

SUMMARY OF THE INVENTION

Thus, it is a primary object of this invention to provide an engraving head which can move a diamond stylus into and out of a cylinder surface of a gravure cylinder at a frequency which facilitates reducing the time required to engrave the cylinder.

Another object of the invention is to provide an engraving head having a magnetostrictive member that facilitates oscillating a stylus at frequencies in excess of 5 KHz or even 10 KHz.

Another object of the this invention is to provide an engraving head which utilizes a magnetostrictive member or actuator which can be compressed to achieve one of a plurality of strain curve characteristics.

Yet another object of the invention is to provide a method and apparatus which is relatively simple in design and fairly inexpensive to manufacture.

In one aspect of the invention, an engraver for engraving a gravure cylinder having an engraving surface is provided. The engraver includes an engraving bed, a headstock and a tailstock slidably mounted on the engraving bed where the headstock and tailstock cooperate to rotatably support the gravure cylinder at an engraving station of the engraver, and an engraving head mounted on the engraving bed at the engraving station to permit the engraving head to engrave the engraving surface. The engraving head includes a housing, an engraving stylus for engraving a cylinder positioned at an engraving station of the engraver, a magneto-restrictive member situated in the housing and operatively coupled to the engraving stylus, and an energizer for energizing the magnetostrictive member to cause the engraving stylus to oscillate to engrave a predetermined pattern of cells on a surface of the cylinder.

In another aspect of the invention, a stylus driver for driving a stylus in an engraver is provided. The stylus driver includes a magnetostrictive member coupled to the stylus, and an energizer for energizing the magnetostrictive member to cause the stylus to oscillate to engrave a predetermined pattern of cells on a surface of a cylinder positioned at an engraving station in the engraver.

In still another aspect of the invention, a method for engraving a predetermined pattern of cells in a cylinder rotatably mounted on an engraver is provided. The method includes the steps of coupling the stylus to a magnetostrictive member, positioning the stylus in proximate relationship with the cylinder, rotating the cylinder, and energizing the magnetostrictive member to oscillate the stylus to engrave the predetermined pattern of cells on the cylinder.

In still another aspect of the invention, an engraving head for use in an engraver is provided. The engraving head includes a housing, an engraving stylus for engraving a cylinder positioned at an engraving station of the engraver, a magnetostrictive member situated in the housing and operatively coupled to the engraving stylus, and an energizer for energizing the magnetostrictive member to cause the engraving stylus to oscillate to engrave a predetermined pattern of cells on a surface of the cylinder.

In still another aspect of the invention, a method for engraving a gravure cylinder is provided which includes the steps of rotatably mounting a gravure cylinder at an engraving station of an engraver, positioning a stylus in proximate relationship with an engraving surface of the gravure cylinder, coupling the stylus to a magnetostrictive member, and energizing the magnetostrictive member to oscillate the stylus during the rotation of the gravure cylinder to engrave the predetermined pattern of cells on a surface of the gravure cylinder.

These and other objects and advantages of the invention will be apparent from the following description, the accompanying drawings and the appended claims.

DETAILED DESCRIPTION OF THE PREFERRED EMBODIMENTS

Figure 1:
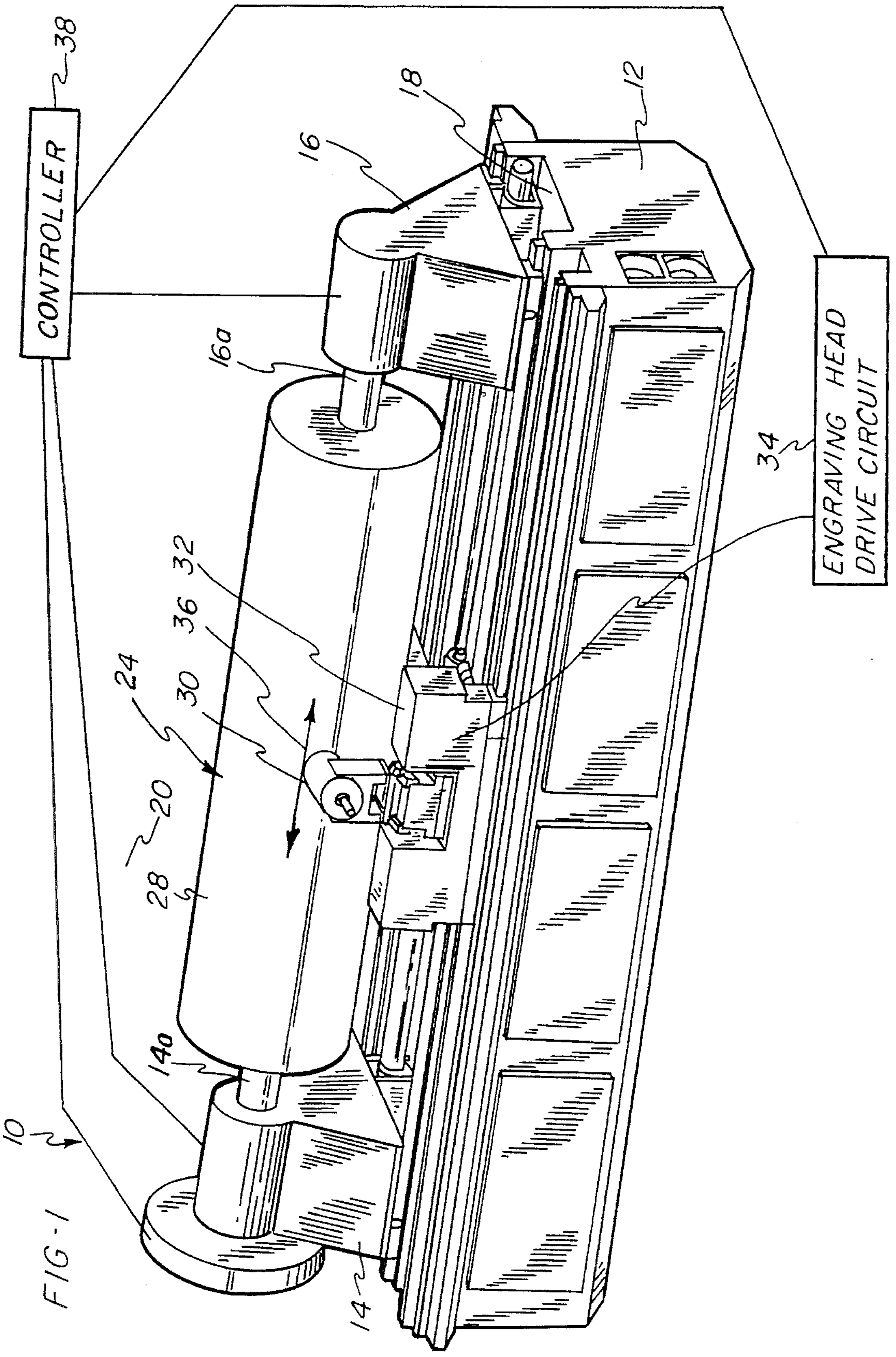
FIG. 1 is a perspective view of an exemplary gravure engraving machine in which the present invention may be used.
Figure 2:
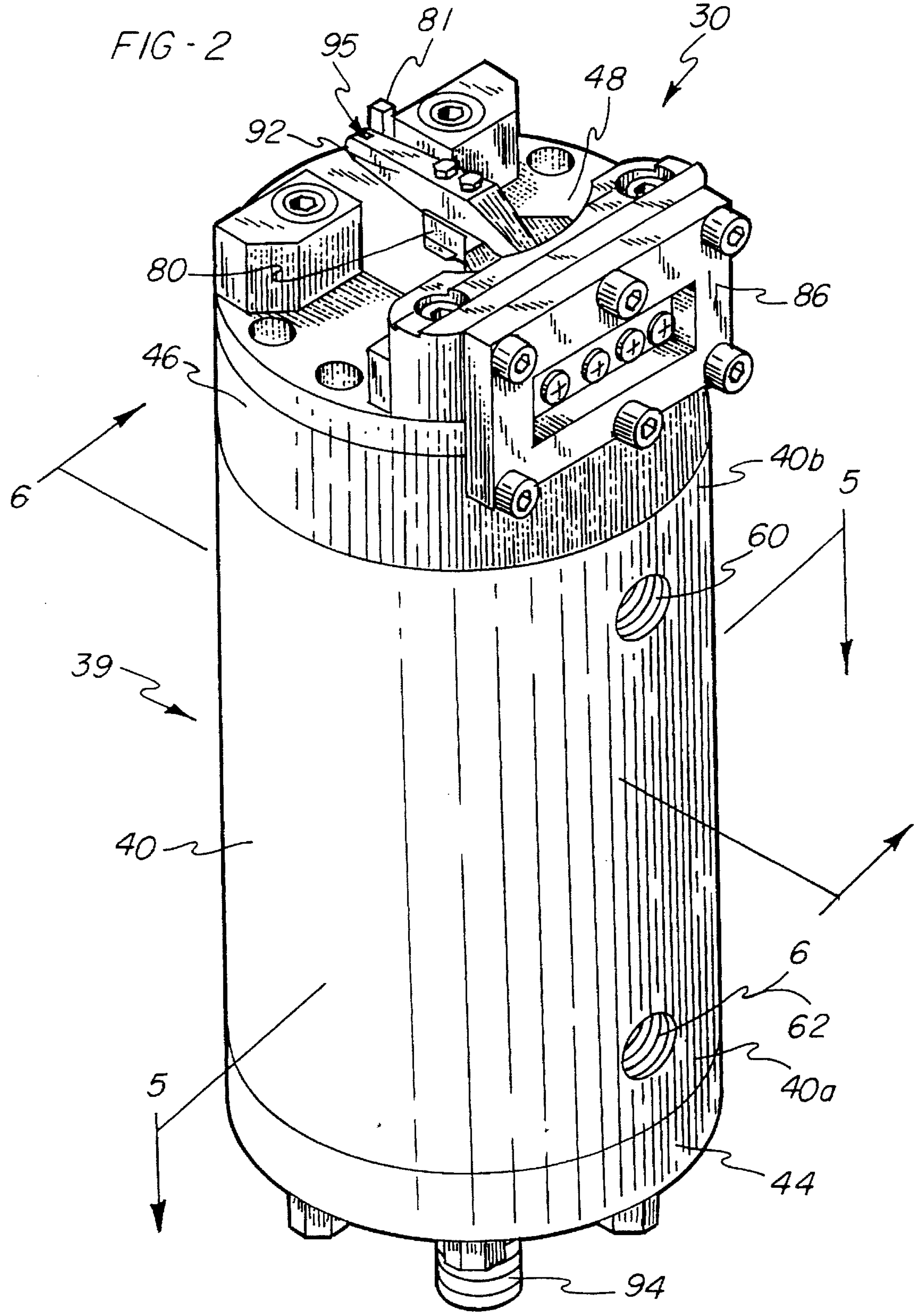
FIG. 2 is a perspective view of an engraving head of the present invention.

Referring now to FIG. 1, there is shown an exemplary engraving machine or engraver 10 such as a gravure engraver. The engraver 10 may have a surrounding slidable safety cabinet structure which is not shown for ease of illustration. Engraver 10 includes a frame or bed 12 having an engraving station comprising a slidably mounted headstock 14 and tailstock 16 which support a cylinder 24. The cylinder 24 can be of varying lengths and diameters. The headstock 14 and tailstock 16 include drivable support shafts 14*a* and 16*a*, respectively, which rotatably support the cylinder 24, and which couple the cylinder 24 to a cylinder drive motor (not shown).

Figure 3:
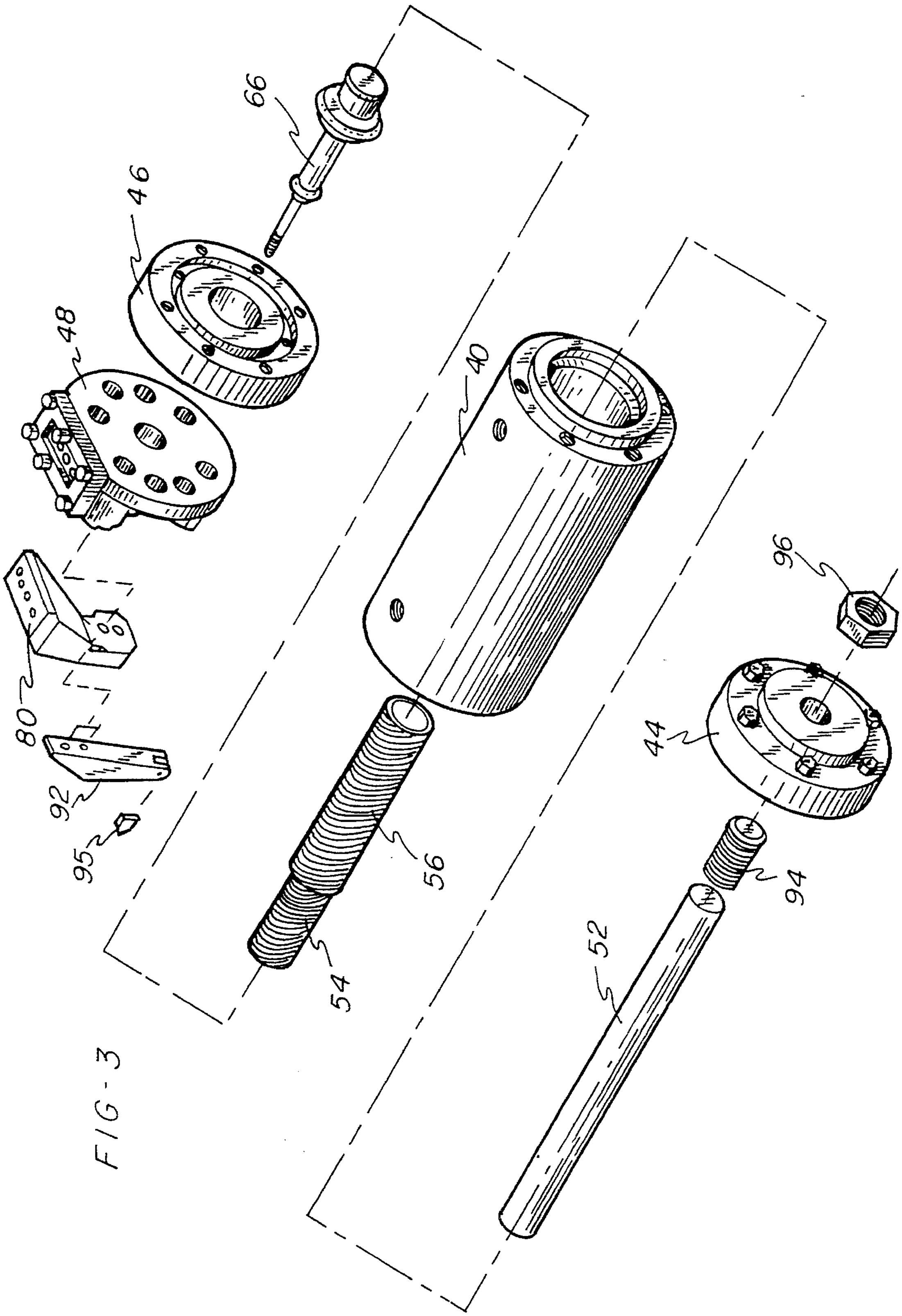
FIG. 3 is an exploded view showing features of the engraving head.
Figure 4:
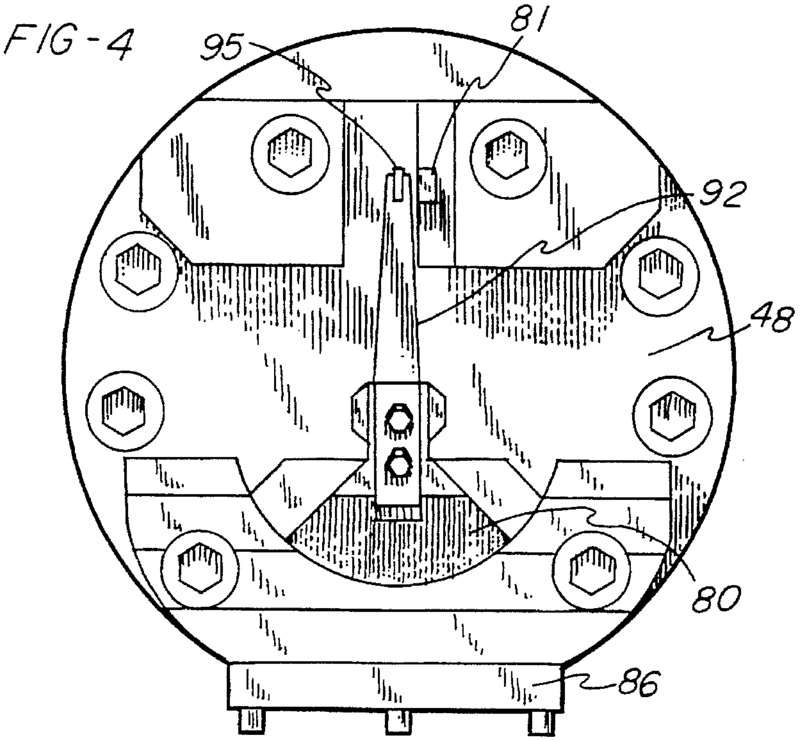
FIG. 4 is an end view of the engraving head shown in FIG. 2.

The cylinder 24 may be plastic or metal such as zinc and typically has a copper-coated engraving surface 28 which is engraved by an engraving head 30 having a cutting tool or stylus 95 (FIG. 3) to be discussed further below. The engraving head 30 is mounted on a carriage 32 (FIG. 1) such that an engraving head drive circuit 34 can cause the cutting tool or stylus 95 (FIG. 6) to move toward and away from the cylinder 24 in a direction which is generally radial with respect to the central axis of the cylinder 24. The carriage 32 is also slidably mounted on the frame 12 such that it can traverse the entire length of the cylinder 24 in the directions shown by the double arrow 36 in accordance with a lead screw/drive motor assembly (not shown).

A programmable controller 38 controls the operation of the engraver 10, and more particularly, the operation of the engraving head 30 and drive motors (not shown) for the headstock 14, tailstock 16, cylinder 24, and carriage 32. The engraving head drive circuit 34 can be integral with the controller 38, or can be separate therefrom as shown in FIG. 1. An exemplary controller is disclosed in U.S. patent application Ser. No. 08/022,127 filed Feb. 25, 1993 now issued as U.S. Pat. No. 5,424,845 and assigned to the same Assignee of the present invention, and which is hereby incorporated by reference and made a part thereof.

Referring now to FIGS. 2–6, the engraving head 30 of the present invention is shown in more detail. The engraving head 30 includes a housing 39 (FIG. 6) having a longitudinal axis 42 (FIG. 6) and having a housing body 40, an end wall body 44 secured to an end 40*a* of the housing body 40, a compression cylinder body 46 secured to the other end 40*b* of the housing body 40, and a stylus arm body 48 secured to the compression cylinder body 46 remote from the housing body 40.

Figure 5:
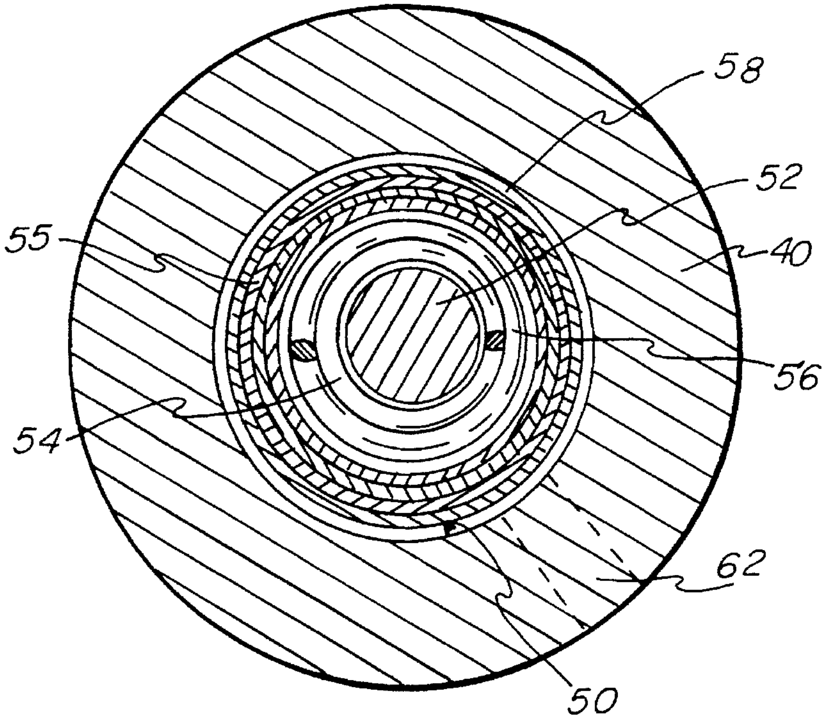
FIG. 5 is a cross-sectional view of the engraving head taken along the line 5—5 in FIG. 2.

With particular reference to FIG. 5, the housing body 40 comprises an internal passageway or cavity 50 having an actuator or magnetostrictive member 52 disposed therein. In the embodiment being described, the actuator 52 is generally centrally disposed and extends generally along the longitudinal axis 42 of the housing body 40. The actuator 52 is generally cylindrical and formed from a magnetorestrictive material having a coefficient of magnetostrictive expansion of at least 500 parts per million. One suitable magnetostrictive material is a magnetic anisotropy compensated alloy $Tb_xDy_{1-x}Fe_2$ known commercially as TERFENOL-D™ which includes the elements terbium (Tb), dysprosium (Dy) and iron (Fe). Terbium and dysprosium are both highly magnetostrictive lanthanides. TERFENOLD-™ is available from Etrema Products, Inc., 306 South 16th Street, Ames, Iowa 50010.

In the embodiment described, the actuator 52 is formed from seven longitudinally extending generally elongate TERFENOL-D™ slices each having a thickness of about 0.070 inch which are laminated together to form a cylindrical rod having a diameter of about 0.5 inches and a length of about three inches, a cross-sectional view of which is shown in FIG. 5. The actuator 52 has a fundamental frequency of approximately 4 KHz and a third harmonic frequency of approximately 12 KHz. In the embodiment being described, the third harmonic is the operating frequency of the engraving head 30 as discussed further below. Preferably, the actuator 52 comprises a length of about six inches or less and a diameter of less than one inch. The actuator 52 could be formed to have different thicknesses, diameters, shapes and/or lengths which form different actuator 52 shapes (e.g. octagonal, hexagonal, rectangular, and the like) and dimensions.

The magnetostrictive properties of the actuator 52 are such that when a magnetic field is applied thereto, small magnetic domains within the actuator 52 rotate to align with the applied magnetic field which causes internal strains within the actuator 52. The internal strains result in an expansion of approximately 0.001 inch per inch of actuator 52 in the direction of the applied magnetic field. As shown by the length or strain vs. magnetic field intensity curve of FIG. 8. The strain S is equal to ΔL/L where L is the length of the actuator, and magnetic field intensity H is equal to nI where I is the current through a surrounding coil of N turns over a coil length $L_c$ with $n=N/L_c$. Notice that if the applied magnetic field is reversed, the internal magnetic domains reverse direction but again align along the magnetic field direction and also result in an increase in length of the actuator 52, as represented by the curve in FIG. 8. As the current is increased in either direction, the magnetic field intensity increases and the length of the actuator 52 increases to a saturation point where no further elongation of the actuator 52 is achieved because the internal magnetic domains are essentially lined up with the surrounding magnetic field.

Figure 7A:
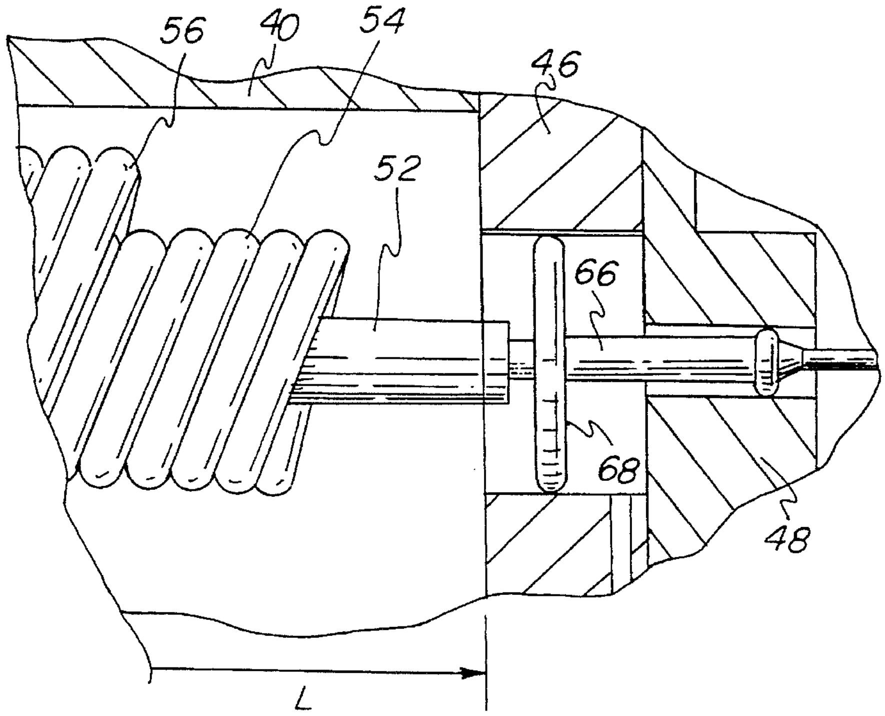
FIGS. 7*a*–7*e* are partially sectional cut-away views of the magnetostrictive actuator of the present invention operating under varying magnetic fields.
Figure 7B:
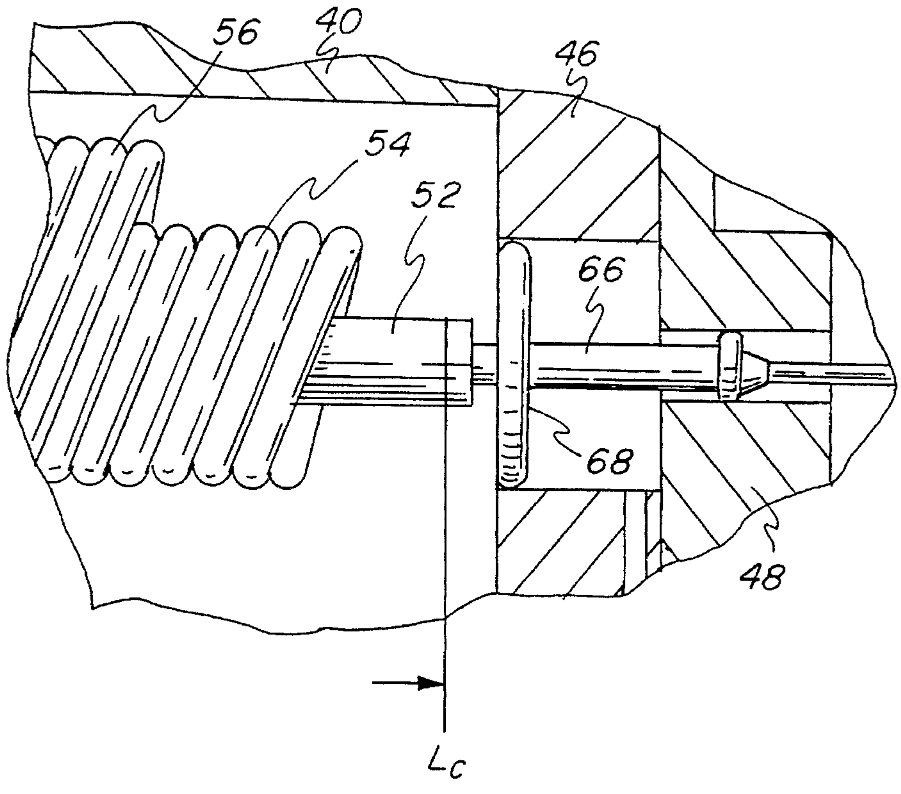
Figure 7C:
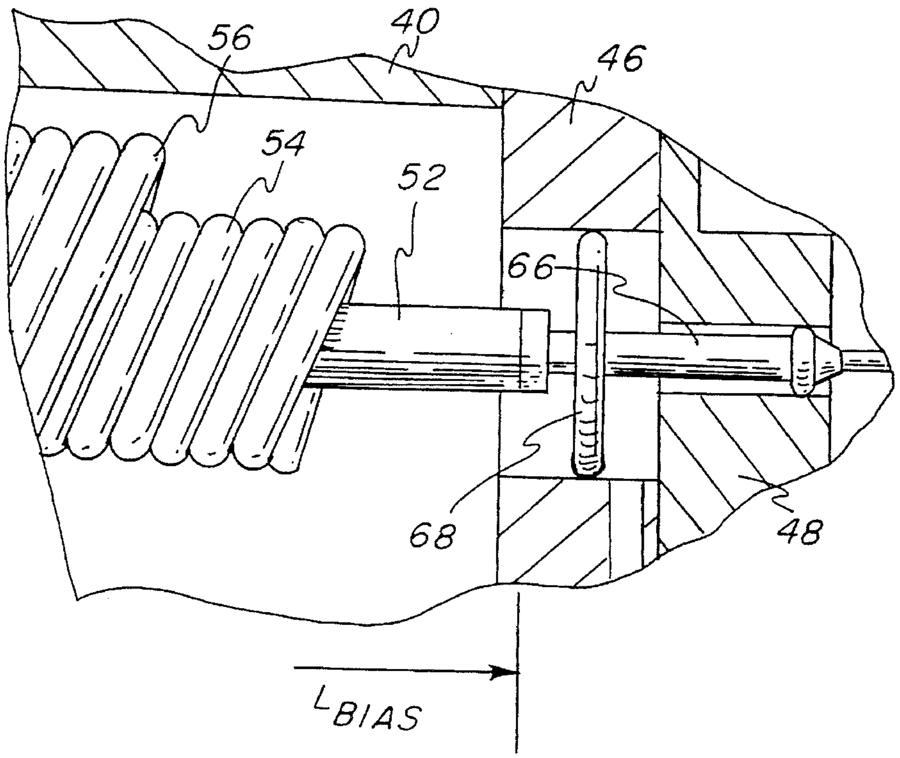
Figure 8:
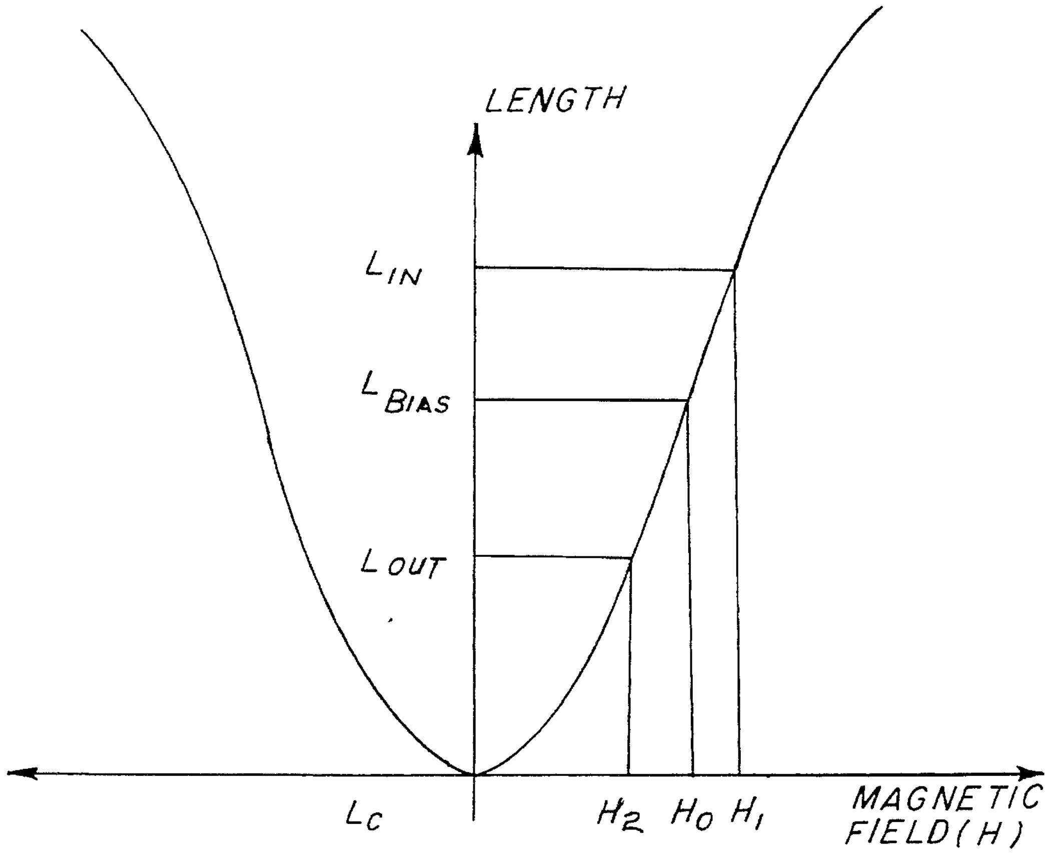
FIG. 8 is a graph showing length or strain vs. magnetic field intensity for the magnetostrictive actuator.

A longitudinally extending drive coil 54 (FIG. 3) is operatively positioned around the actuator 52 as shown. A longitudinally extending bias coil 56 is positioned around and spaced radially outwardly from the drive coil 54. The drive coil 54 and bias coil 56 cooperate to operate as an energizer for energizing the actuator 52, but it should be appreciated that a single coil may be used to energize the magnetostrictive member 52 if desired. The bias coil 56 is used to establish a DC biasing field $H_0$ (FIG. 8) about the actuator 52 which biases the actuator 52 from a compressed length $L_c$ (as shown in FIGS. 7*b* and 8) to a biased operating length $L_{bias}$ (as shown in FIGS. 7*c* and 8). In the embodiment being described, the length $L_{bias}$ is approximately one-half the total possible linear expansion limit of the actuator 52. Alternatively, the DC biasing field $H_0$ could be established with a permanent magnet (not shown) which replaces the bias coil 56.

Figure 7D:
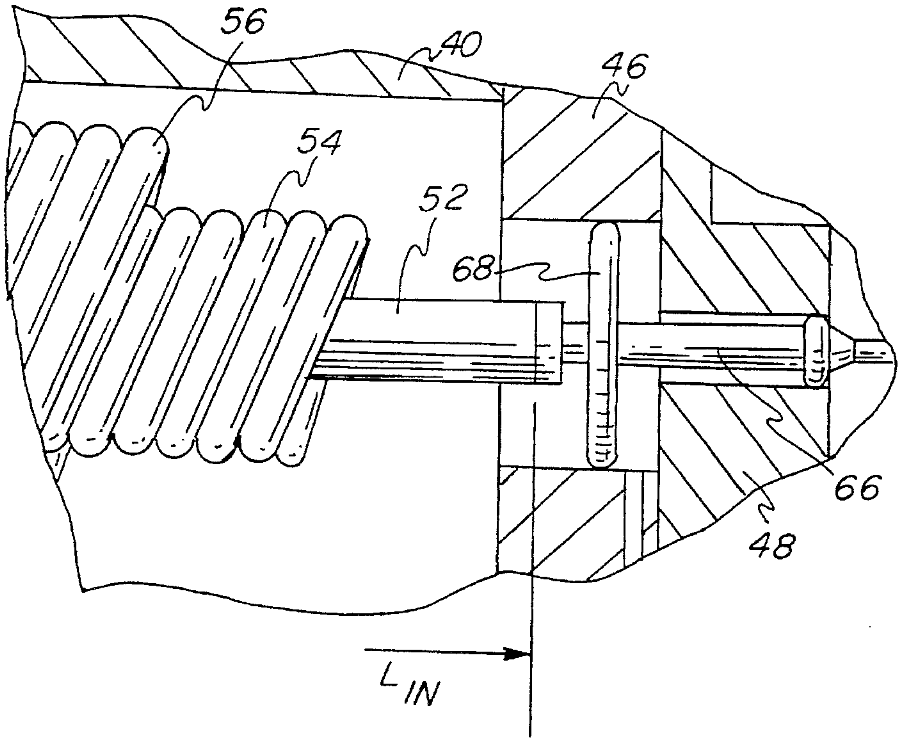
Figure 7E:
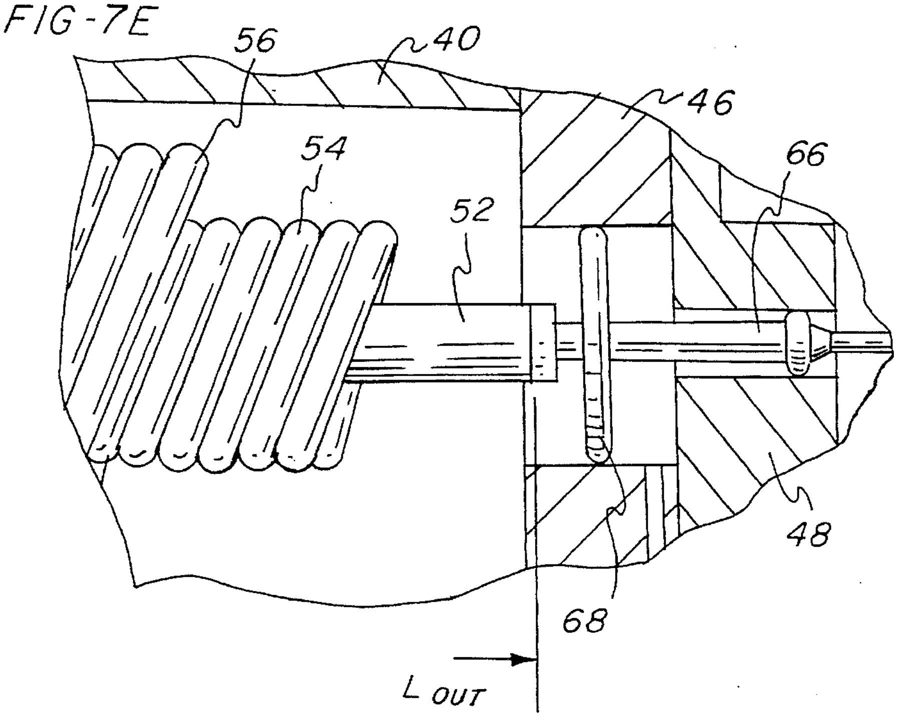

After the actuator 52 is biased to the operating length $L_{bias}$ by the bias coil 56, a composite drive signal 116 (FIG. 11), as discussed further below, is applied to the drive coil 54 to modulate the magnetic field intensity established by the bias coil 56. In this regard, when a positive current flows through the drive coil 54, the magnetic field created by the current flow adds to the DC biasing field creating a resulting magnetic field $H_1$ which causes the additional expansion of the actuator 52 from the length $L_{bias}$ to the length $L_{in}$ (as shown in FIGS. 7*d* and 8). When a negative current flows through the drive coil 54, the magnetic field created by the negative going current cancels the DC biasing field creating a resulting magnetic field $H_2$ (FIG. 8) which causes the actuator 52 to contract from the length $L_{bias}$ or $L_{in}$ to a length $L_{out}$ for a net actuator 52 expansion of $L_{out}$ (as shown in FIGS. 7*e* and 8). Thus, an axially oriented oscillation is established about the length $L_{bias}$ with an operating range of $L_{in}$ to $L_{out}$.

In the embodiment being described, about 7.0 amperes of current flows through an approximately 300-turn bias coil 56 to provide about 2100 AT (ampere-turns) for generating the DC biasing field which causes a the actuator 52 to initially expand approximately 50 microns to reach the operating length $L_{bias}$. The composite drive signal 116 then causes the actuator 52 to alternatively expand and contract about 25 microns from the operating length $L_{bias}$ to the reach the lengths $L_{in}$ and $L_{out}$, respectively, for a net operating range of about 50 microns.

A plurality of longitudinally extending steel laminations 55 (FIG. 6) overlap the bias coil 56. The laminations 55 facilitate reducing the flow of eddy currents in the steel housing body 40 and provide a return path for the magnetic lines of flux that are generated when current flows through the drive and bias coils 54, 56. A pair of longitudinally spaced-apart retainer rings 58 are interposed between the steel laminations 55 and a radially inner surface of the housing body 40.

A coolant inlet 60 and a coolant outlet 62 extending through the housing body 40 permit a liquid coolant to be pumped through the cavity 50. More particularly, the liquid coolant flows between the actuator 52 and drive coil 54, and the drive coil 54 and bias coil 56 to reduce the heat generated as a result of hysteresis and eddy currents in the actuator 52 during operation. The retainer rings 58 prevent the coolant from passing between the housing body 40 and the bias coil 56 where minimal heat dissipation is required. The coolant is preferably a silicon-based coolant having non-conductive properties.

The present invention also comprises compression means or a compressor for axially compressing the actuator 52. In this regard, the compression cylinder body 46 is secured to the housing body 40 by conventional means such as threaded screws, bolts, or the like. The compression cylinder body 46 includes a central chamber or cavity 64 which communicates with the cavity 50. A longitudinally extending piston rod or shaft 66 is centrally disposed and is generally coaxial with actuator 52 such that it can axially drive the actuator 52. The piston rod 66 has a piston 68 formed integral therewith and disposed for axial movement within the central cavity 64. An annular seal or O-ring 70 extends circumferentially about the piston 68 and elastically contacts a radially inner wall 72 defining the cavity 64. A second annular seal or O-ring 82 extends circumferentially about the piston rod 66 and elastically contacts an inner wall 84 defining a central bore 78 to effectively seal a pressurized chamber 74 defined by the piston 68 and the inner wall 72. A pressure inlet/outlet port 76 extends through the compression cylinder body 46 to provide a quantity of pressurized hydraulic or preferably pneumatic medium to the chamber 74 from a supply source (not shown).

Notice that a stylus arm body 48 is secured to the compression cylinder body 46 by conventional means such as threaded screws, bolts, or the like. The piston rod 66 passes longitudinally through the central bore 78 and threadably engages a cantilevered arm 80 extending transverse to the piston rod 66.

When the chamber 74 is pressurized, the piston 68 exerts and maintains a compressive force against the actuator 52. This facilitates preventing the actuator 52 from operating in tension, and it also enables a user to select an optimum or desired operational curve for the actuator 52 as described below. With regard to undesirable tension, moderate tensile forces can cause the actuator 52 to fracture at nodal points along the length of the actuator 52. To facilitate avoiding the possibility of fracturing, the actuator 52 is maintained in compression by applying approximately 500 psi of a regulated pneumatic medium such as air to the chamber 74. This, in turn, causes the piston 68 to apply approximately 375 pounds of compressive force to the actuator 52 (assuming a piston area of approximately 0.75 $inch^2$). The actuator 52 contracts from a non-biased quiescent length L (as shown in FIG. 7*a*) to the compressed length $L_c$ (as shown in FIGS. 7*b* and 8) with the compressive force applied thereto.

Figure 9:
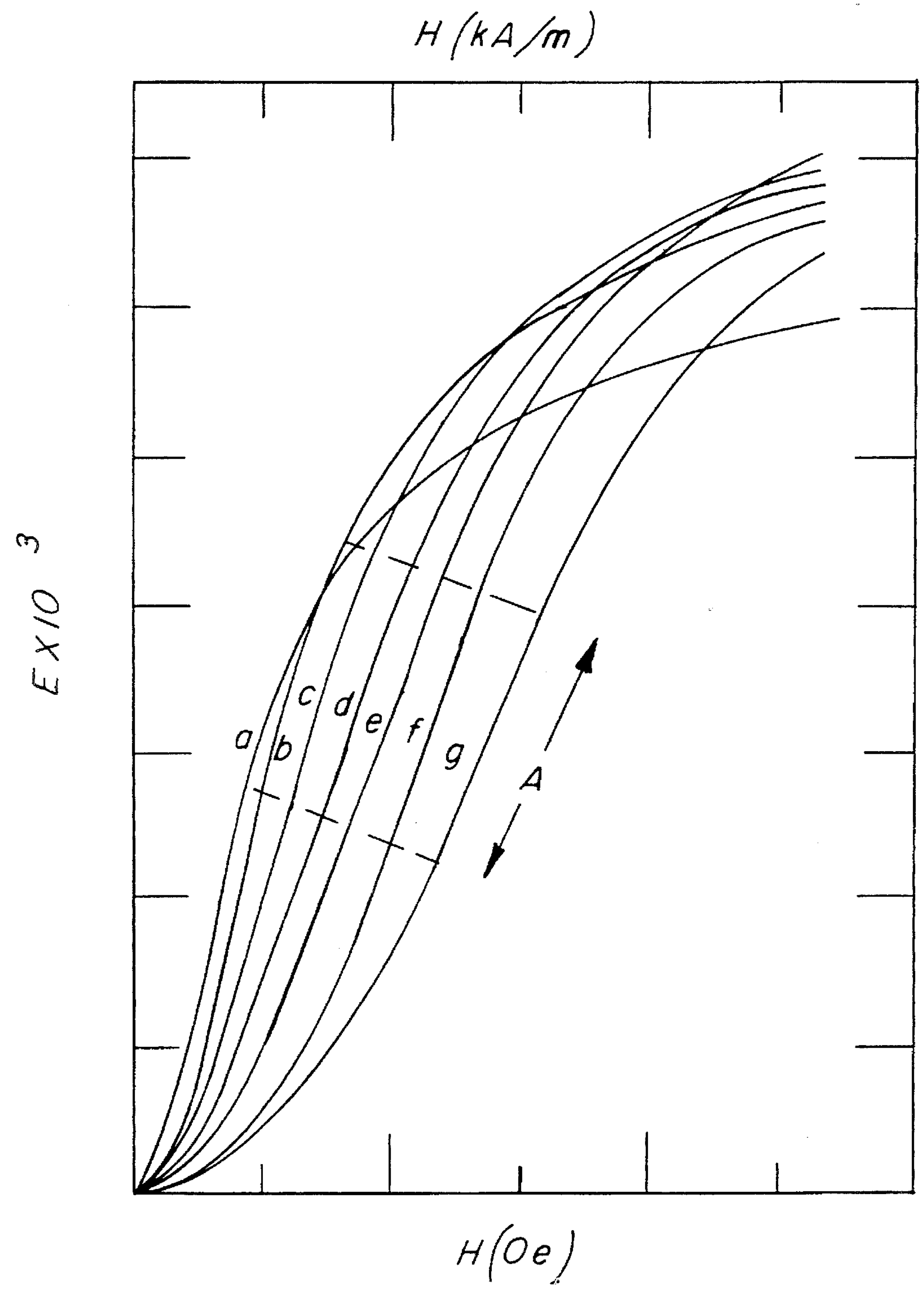
FIG. 9 is a graph showing a family or plurality of length or strain vs. magnetic field intensity curves for various compression levels of the magnetostrictive actuator.

With regard to selecting an optimum or desired operational curve for actuator 52, a family or plurality of length or strain vs. magnetic field intensity operational curves for the actuator 52 under various levels of compression is shown in FIG. 9. Curve (g) represents operational characteristics when a particular compressive force is applied to the actuator 52. Curve (a) represents operational characteristics of the actuator 52 when a smaller compressive force is applied to the actuator 52. Notice that as the compressive force increases from curve (a) to curve (g), the operating range (such as indicated by double arrow A in FIG. 9) becomes fairly linear. This permits a desired or optimum operating curve to be selected which exhibits a desired linear operating range for modulating the actuator 52 as discussed above.

Figure 6:
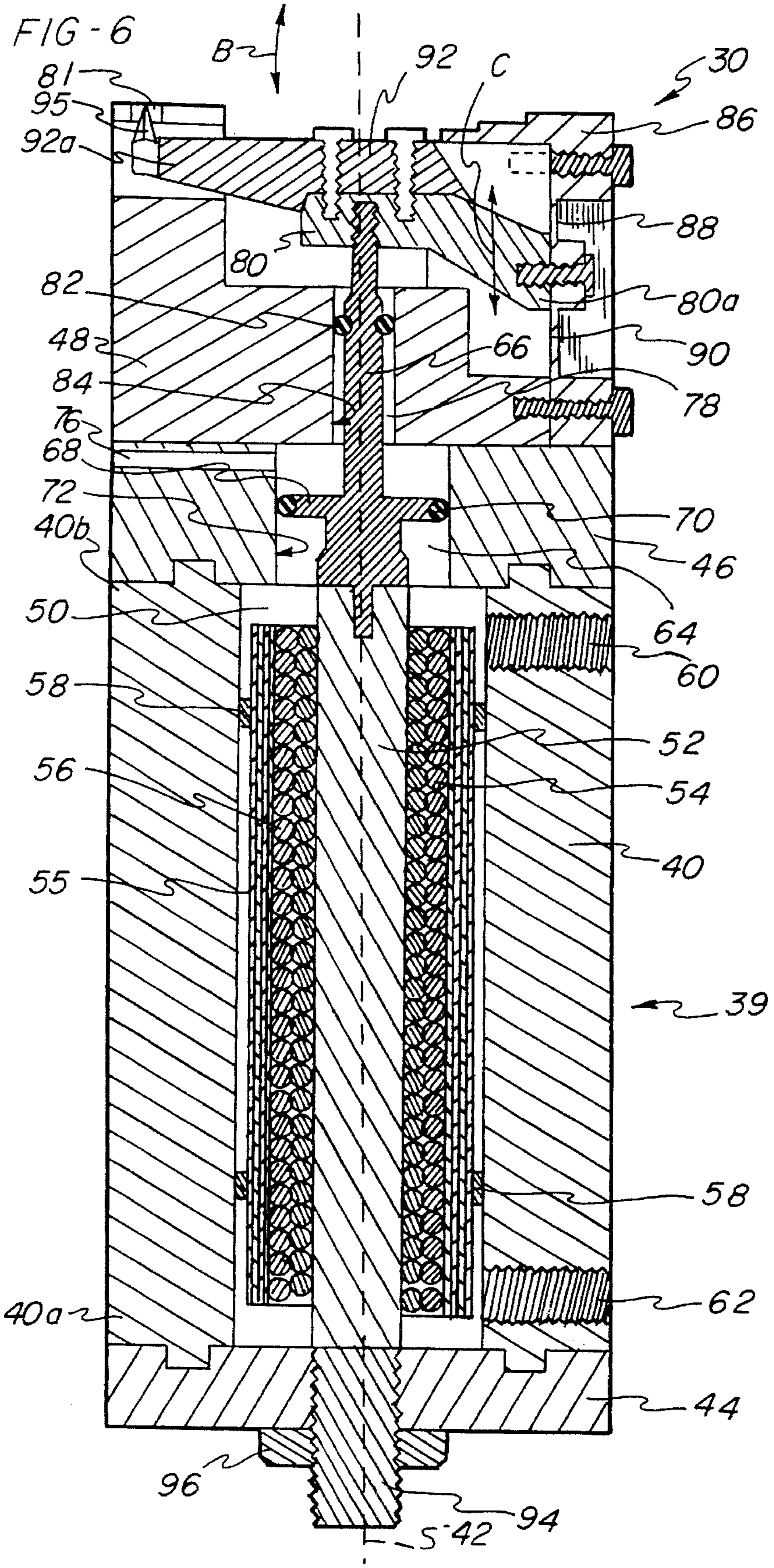
FIG. 6 is a longitudinal sectional view of the engraving head taken along the line 6—6 in FIG. 2.

In the embodiment being described, an amplifier or amplification means for amplifying the expansion of the actuator 52 may be utilized. One suitable amplifier may comprise the cantilevered or amplifier arm 80 (FIG. 6) which has one end thereof **80*a* rigidly secured to a backing plate 86 which is oriented in a plane extending generally tangential to the axis 42 (FIG. 6). The backing plate 86 includes first and second flexible spring plate bodies 88 and 90, respectively, which extend parallel to the longitudinal axis 42. The spring plate bodies 88 and 90 flex to permit the cantilevered arm 80 to pivot in the direction of double arrow B in FIG. 6 about the backing plate 86 while preventing relative movement or "backlash" between the backing plate 86 and the end 80*a* of the cantilevered arm 80. That is, the backing plate 86 and the end 80*a* of the cantilevered arm 80 form a rigid bearing having no movement or play in the direction of double arrow C in FIG. 6**.

A stylus arm 92 is secured to the cantilevered arm 80 by conventional securing means. The diamond cutting or engraving stylus 95 is supported at a pivoting end **92*a* of the stylus arm 92. Although not shown, the stylus arm 92 may include a plurality of apertures or holes therethrough which reduce the weight of the stylus arm 92. The apertures will help raise the resonant frequency of the stylus arm 92 above the operating frequency of the engraving head 30 to prevent interference during operation. Also, the cantilevered arm 80 and stylus arm 92 may be combined into an integral one-piece construction which is pivotally secured to the backing plate 86 and which supports the cutting stylus 95 in the same or similar manner. A guide shoe 81 is mounted on the stylus arm body 48 in a precisely known position relative to the oscillating stylus 95. When the guide shoe 81 contacts the cylinder 24, the stylus 95 oscillates from an engraving position just barely touching the cylinder 24 to a retracted position away from the cylinder 24** as discussed above.

It should be appreciated that the piston rod 66, cantilevered arm 80 and stylus arm 92 cooperate to form a mechanical amplifier which provides an amplification ratio or gain of approximately either 2:1 or 3:1. Thus, if the actuator 52 has an operating range between $L_1$ and $L_2$ of 20 microns, then the mechanical amplifier provides a 60 micron displacement of the diamond stylus 95 toward and into the copper-plated surface 28 of the cylinder 24 to effect engraving of one or more cells as discussed further below.

Alternatively, amplification may be performed by other means. For example, the amplifier or amplification means could comprise a hydraulic or pneumatic amplifier which includes a housing having two spaced-apart diaphragms (not shown) defining a hydraulic fluid filled reservoir or bladder therebetween. The amount of amplification derived from the amplifier is related to a difference ratio between the diaphragm diameters. To achieve amplification, a larger diameter diaphragm could abut against the actuator 52 or a compression means interposed between the diaphragm and actuator 52, and a smaller diameter diaphragm could directly drive the stylus 95 or could abut against the stylus arm 92. In operation, a small axial movement of actuator 52 against the larger diameter diaphragm causes a greater axial movement of the smaller diaphragm and thus an amplified axial movement of the stylus.

Note that an end wall body 44 is secured to the housing body 40 by conventional means such as threaded screws, bolts, or the like. An adjustment screw 94 extends through a central threaded bore in the end wall body 44 and coaxially abuts against the actuator 52. The end wall body 44 and adjustment screw 94 serve as a rigid body to anchor an end of the actuator 52 during operation. Further, the screw 94 can be used to adjust the axial position of the actuator 52 and more particularly the radial distance separating the diamond stylus 95 from the cylinder 24 when the engraving head 30 is mounted on the carriage 32. A lock-nut 96 secures the adjustment screw 94 to the end wall body 44.

Figure 10:
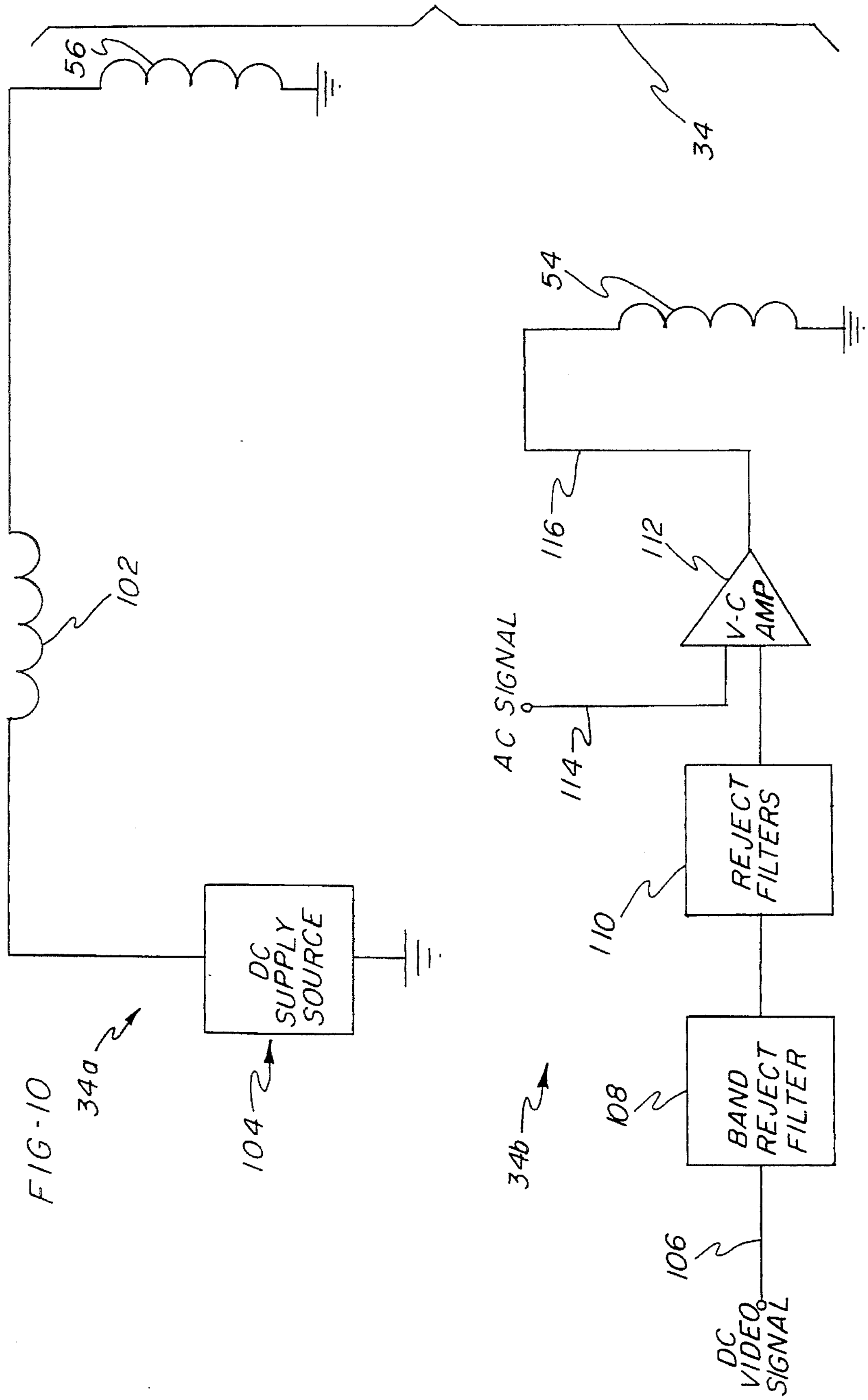
FIG. 10 is a block diagram of an exemplary engraving head driver circuit.

FIG. 10 illustrates a block diagram of the engraving head drive circuit 34 shown in FIG. 1. The circuit 34 comprises a bias coil circuit **34*a* and a drive coil circuit 34*b*. With reference to the bias coil circuit 34*a*, a large inductor 102 is placed in series with a DC supply source 104 and the bias coil 56 to counter the effects of transformer action between the drive coil 54 and bias coil 56. Transformer action could detrimentally induce currents into the bias coil circuit 34*a* to nullify the drive circuit 34*b* if not nullified. Further, the drive coil 54 is positioned within the bias coil 56 and is made smaller than the bias coil 56 to thereby minimize the inductance characteristics of the drive coil 54**.

With reference to the drive coil circuit **34*b*, a DC video or imaging signal 106 (FIGS. 10 and 11) representing the image to be engraved into the cylinder 24 is applied to one or more band reject filters 108 and 110. The band reject filters 108, 110 reject the fundamental and/or other higher frequencies that the actuator 52 may introduce into the various engraving head components (i.e. the housing body 40, end wall body 44, compression cylinder body 46 and stylus arm body 48, piston rod 66, cantilevered arm 80, stylus arm 92, etc.) which oscillate in response to the actuator 52 operating at the third harmonic frequency of the actuator 52**. U.S. Pat. No. 4,450,486 discloses techniques for damping the engraving head components which oscillate in response to an actuator and which is incorporated by reference and made a part hereof.

After being conditioned by the filters 108 and 110, the DC video signal is applied to a voltage-to-current amplifier 112 and summed with a constant frequency AC input signal 114 to produce a composite drive signal 116 having both AC and DC components. The AC input signal 114 and DC video signal 106 are produced within a circuit (not shown) in the controller 38.

In operation, the controller 38 directs the engraving head 30 to urge the diamond-tipped stylus arm 92 into contact with the cylinder 24 to engrave a predetermined pattern or series of controlled-depth cells arranged in a circumferential track (not shown) on the copper-plated surface 28 thereof. The linear movement of the carriage 32 produces a series of axially-spaced circular tracks containing cells which represent the image to be engraved.

The AC component 114 of the drive signal 116 causes the stylus arm 92, and more particularly the stylus 95 to oscillate in a sinusoidal manner relative to the cylinder 24 at an operating frequency of between approximately 10 to 15 KHz. The rotational speed of the cylinder drive motor 26 is adjusted so as to produce an engraving track having an odd number of wavelengths during each complete rotation of the cylinder 24.

Figure 11:
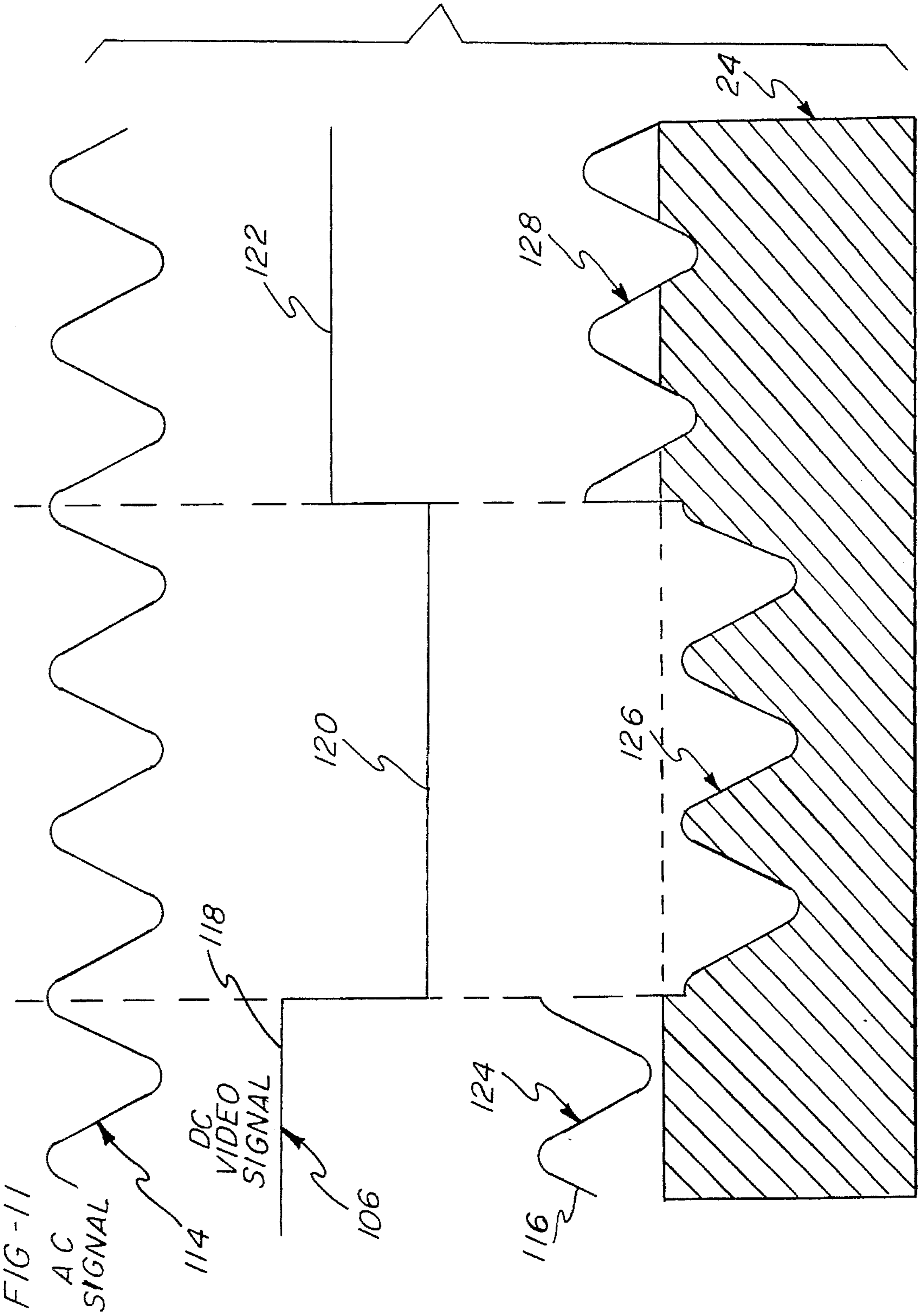
FIG. 11 is a schematic illustration of an AC component signal, a DC component signal and a drive signal for energizing the magnetostrictive member.

With reference to FIG. 11, the DC video component 106 of the composite drive signal 116 utilizes a plurality of discrete DC voltage levels to signal the action to be taken by the stylus 95. For instance, the DC video component 106 includes a white video level 118, a black video level 120 and a highlight video level 122. When the white video level 118 is present in the composite drive signal 116, the actuator 52 contracts to the length $L_{out}$ and the diamond stylus 95 is raised out of contact with the cylinder surface 28 as shown by the stylus position 124.

When the DC video component 106 goes from the white video level 118 to the black video level 120, the actuator 52 elongates to a length $L_{in}$ and the diamond stylus 95 moves into engraving contact with the cylinder surface 28 as shown by the stylus position 126. When the DC video component shifts to the highlight video level 122, the actuator elongates to a length somewhere between $L_{in}$ and $L_{out}$ and the diamond stylus 95 oscillates in and out of engraving contact with the cylinder 24 as shown by the stylus position 128. This oscillation in turn causes the engraver 10 to engrave the predetermined pattern.

While the forms of the device herein described constitute the preferred embodiments of the invention, it is to be understood that the invention is not limited to these precise forms of device, and that changes may be make therein without departing from the scope of the invention which is defined in the appended claims.

For instance, instead of introducing the bias current through the separate bias coil 56, the bias current may be introduced by means of a magnet, or by applying DC bias current to the drive coil 54 through a series inductor placed in parallel with the composite drive signal 116 which is applied to the drive coil 54 through a series capacitor. One coil can be used to carry the bias current, the AC current and the video imaging signal current from a single circuit.

Also, a bellville washer may be utilized to provide linear compression of the actuator 52 in place of the pneumatic or hydraulic compression cylinder body 46.

Further, in order to increase the resonant frequency of the engraving head housing 39 above the operating frequency of the actuator 52, the rigidity of the housing 39 can be increased by welding or otherwise firmly securing together the housing body 40, end wall body 44, compression cylinder body 46 and stylus arm body 48 rather than using conventional securing means such as the above-mentioned threaded screws, bolts, or the like. Also, the resonant frequency can be increased by forming a unitary housing incorporating therein the some or all of the bodies 40, 44, 46 and 48.

For certain types of engraving operations, there is sufficient elongation of the actuator 52 to drive the stylus 95 directly from the actuator without the use of an amplifier. Thus, the stylus 95 could be positioned substantially in-line with the actuator 52.

Further, the actuator 52 could work against a largely rigid or fixed mass instead of working against the housing 39 and particularly the end wall body 44.

What is claimed is:

1. An engraver for engraving a cylinder having an engraving surface comprising:

an engraving bed;

a headstock and a tailstock mounted on said engraving bed; said headstock and tailstock cooperating to rotatably support said cylinder at an engraving station of said engraver;

an engraving head mounted on said engraving bed at said engraving station to permit the engraving head to engrave said engraving surface;

said engraving head comprising:

a housing;

an engraving stylus for engraving a cylinder positioned at said engraving station of said engraver;

a magnetostrictive member situated in the housing and operatively coupled to said engraving system; and an energizer for energizing said magnetostrictive member to cause said engraving stylus to oscillate to engrave a predetermined pattern of cells on a surface of said cylinder.

2. The engraver as recited in claim 1 wherein said magnetostrictive member comprises a plurality of strain curves, said engraver further comprising:

a compressor for compressing said magnetostrictive member to achieve at least one of said plurality of strain curves.

3. The engraver as recited in claim 1 wherein said magnetostrictive member has a coefficient of magnetostrictive expansion of at least 500 parts per million.

4. The engraver as recited in claim 1 wherein said magnetostrictive member comprises $Tb_xDy_{1-x}Fe_2$.

5. The engraver as recited in claim 1 wherein said energizer comprises at least one coil.

6. The engraver as recited in claim 5 wherein said magnetostrictive member comprises a plurality of strain curves, said engraving head further comprising:

a compressor for compressing said magnetostrictive member to achieve at least one of said plurality of strain curves.

7. The engraver as recited in claim 6 wherein said magnetostrictive member comprises $Tb_xDy_{1-x}Fe_2$.

8. The engraver as recited in claim 1 wherein said magnetostrictive member is cylindrical in cross-section.

9. The engraver as recited in claim 1 wherein said magnetostrictive member cylindrical and comprises a length of less than six inches and a diameter of less than one inch.

10. The engraver as recited in claim 1 further comprising:

an amplifier positioned between said stylus and said magnetostrictive member.

11. The engraver as recited in claim 10 wherein said amplifier amplifies said expansion by a ratio of at least 2:1, wherein said ratio corresponds to the movement of said styllus relative to the expansion of said magnetostrictive member.

12. The engraver as recited in claim 10 wherein said amplifier comprises an amplifier arm coupled to said magnetostrictive member and said stylus.

13. The engraver as recited in claim 1 wherein said magnetostrictive member is substantially co-axial with said stylus.

14. A stylus driver for driving a stylus in an engraver comprising:

a magnetostrictive member coupled to the stylus; and an energizer for energizing said magnetostrictive member to cause said stylus to oscillate.

15. The stylus driver as recited in claim 14 wherein said magnetostrictive member comprises a plurality of strain curves, said stylus driver further comprising:

a compressor for compressing said magnetostrictive member to achieve at least one of said plurality of strain curves.

16. The stylus driver as recited in claim 14 wherein said magnetostrictive member has a coefficient of magnetostrictive expansion of at least 500 parts per million.

17. The stylus driver as recited in claim 14 wherein said magnetostrictive member comprises $Tb_xDy_{1-x}Fe_2$.

18. The stylus driver as recited in claim 14 wherein said energizer comprises at least one coil operatively associated with said magnetostrictive member.

19. The stylus driver as recited in claim 18 wherein said magnetostrictive member comprises a plurality of strain curves, said stylus driver further comprising:

a compressor for compressing said magnetostrictive member to achieve at least one of said plurality of strain curves.

20. The stylus driver as recited in claim 19 wherein said magnetostrictive member comprises $Tb_xDy_{1-x}Fe_2$.

21. The stylus driver as recited in claim 14 wherein said magnetostrictive member is cylindrical in cross-section.

22. The stylus driver a recited in claim 14 wherein said magnetostrictive member comprises a length of less than six inches and a diameter of less than one inch.

23. The stylus driver as recited in claim 14 further comprising:

an amplifier positioned between said stylus and said magnetostrictive member.

24. The stylus as recited in claim 23 wherein said amplifier amplifies said expansion by a ratio of less than 2:1, wherein said ratio corresponds to the movement of said stylus relative to the expansion of said magnetostrictive member.

25. The stylus driver as recited in claim 23 wherein said amplifier comprises an amplifier arm coupled to said magnetostrictive member and said stylus.

26. The stylus driver as recited in claim 14 wherein said magnetostrictive member is substantially co-linear with said stylus.

27. A method for engraving a predetermined pattern of cells in a cylinder rotatably mounted on an engraver comprising the steps of:

coupling a stylus to a magnetostrictive member;

positioning the stylus in proximate relationship with the cylinder;

rotating said cylinder; and energizing said magnetostrictive member to oscillate said stylus.

28. The method as recited in claim 27 wherein said energizing step comprises the steps of:

positioning at least one coil around said magnetostrictive member;

energizing said at least one coil.

29. The method as recited in claim 27 wherein said magnetostrictive member comprises a plurality of strain curves, said method further comprising the step of:

compressing the magnetostrictive member to achieve one of said plurality of strain curves.

30. The method as recited in claim 27 wherein said method further comprises the step of:

biasing said magnetostrictive member to a biased condition.

31. The method as recited in claim 30 wherein said method further comprises the step of:

energizing said magnetostrictive member to oscillate the stylus while in the biased condition.

32. The method as recited in claim 27 wherein said ratio corresponds to the movement of said stylus relative to the expansion of said magnetostrictive member; said method further comprises the step of:

amplifying said expansion of said magnetostrictive member by a predetermined amplification amount.

33. The method as recited in claim 32 wherein said predetermined amplification amount is a ratio of about 2:1.

34. The method as recited in claim 27 wherein said method comprises the step of:

mounting said stylus in line with a magnetostrictive member.

35. The method as recited in claim 27 wherein said method comprises the step of:

using a magnetostrictive member having a coefficient of magnetostrictive expansion of at least 500 parts per million.

36. The method as recited in claim 35 wherein said magnetostrictive member comprises $Tb_xDy_{1-x}Fe_2$.

37. The method as recited in claim 27 wherein said magnetostrictive member comprises $Tb_xDy_{1-x}Fe_2$.

38. An engraving head for use in an engraver comprising:

a housing;

an engraving stylus for engraving a cylinder positioned at an engraving station of said engraver;

a magnetostrictive member situated in the housing and operatively coupled to said engraving stylus; and an energizer for energizing said magnetostrictive member which causes said engraving stylus to oscillate to engrave a predetermined pattern of cells on a surface of said cylinder.

39. The engraving head as recited in claim 38 wherein said magnetostrictive member comprises a plurality of strain curves, said engraving head further comprising:

a compressor for compressing said magnetostrictive member to achieve at least one of said plurality of strain curves.

40. The engraving head as recited in claim 38 wherein said magnetostrictive member has a coefficient of magnetostrictive expansion of at least 500 parts per million.

41. The engraving head as recited in claim 38 wherein said magnetostrictive member comprises $Tb_xDy_{1-x}Fe_2$.

42. The engraving head as recited in claim 38 wherein said energizer comprises at least one coil.

43. The engraving head as recited in claim 42 wherein said magnetostrictive member comprises a plurality of strain curves, said engraving head further comprising:

a compressor for compressing said magnetostrictive member to achieve at least one of said plurality of strain curves.

44. The engraving head as recited in claim 43 wherein said magnetostrictive member comprises $Tb_xDy_{1-x}Fe_2$.

45. The engraving head as recited in claim 38 wherein said magnetostrictive member is cylindrical in cross-section.

46. The engraving head as recited in claim 38 wherein said magnetostrictive member is cylindrical and comprises a length of less than six inches and a diameter of less than one inch.

47. The engraving head as recited in claim 38 further comprising:

an amplifier positioned between said stylus and said magnetostrictive member.

48. The engraving head as recited in claim 47 wherein said magnetostrictive member expands when energized and said amplifier amplifies said expansion by a ratio of not more than 2:1.

49. The engraving head as recited in claim 48 wherein said amplifier comprises an amplifier arm coupled to said magnetostrictive member and said stylus.

50. The engraving head as recited in claim 38 wherein said magnetostrictive member is substantially co-axial with said stylus.

51. A method for engraving a cylinder comprising:

rotatably mounting said cylinder at an engraving station of an engraver;

positioning a stylus coupled to a magnetostrictive member in proximate relationship with an engraving surface of said cylinder; and energizing said magnetostrictive member to oscillate said stylus during the rotation of said cylinder to engrave the predetermined pattern of cells on said engraving surface of said cylinder.

52. The method as recited in claim 51 wherein said energizing step comprises the steps of:

positioning at least one coil around said magnetostrictive member;

energizing said at least one coil.

53. The method as recited in claim 51 wherein said magnetostrictive member comprises a plurality of strain curves, said method further comprising the step of:

compressing the magnetostrictive member to achieve one of said plurality of strain curves.

54. The method as recited in claim 51 wherein said method further comprises the step of:

biasing said magnetostrictive member to a biased condition.

55. The method as recited in claim 54 wherein said method further comprises the step of:

energizing said magnetostrictive member to oscillate the stylus while in the biased condition.

56. The method as recited in claim 51 wherein said magnetostrictive member expands during said energizing step method further comprises the step of:

amplifying the expansion of said magnetostrictive member by a predetermined amplification amount.

57. The method as recited in claim 56 wherein said predetermined amplification amount is a ratio of at least 2:1.

58. The method as recited in claim 51 wherein said method comprises the step of:

mounting said stylus in line with a magnetostrictive member.

59. The method as recited in claim 51 wherein said method comprises the step of:

using a magnetostrictive member having a coefficient of magnetostrictive expansion of at least 500 parts per million.

60. The method as recited in claim 59 wherein said magnetostrictive member comprises $Tb_xDy_{1-x}Fe_2$.

61. The method as recited in claim 51 wherein said magnetostrictive member comprises $Tb_xDy_{1-x}Fe_2$.

* * * * *

UNITED STATES PATENT AND TRADEMARK OFFICE

CERTIFICATE OF CORRECTION

PATENT NO. : 5,491,559
DATED : February 13, 1996
INVENTOR(S) : Buechler

It is certified that error appears in the above-indentified patent and that said Letters Patent is hereby corrected as shown below:

Column 1, line 54, after "the", please delete "this".

Column 3, line 67, after "a", please delete "magnetorestrictive" and insert --magnetostrictive-- therefor.

Column 5, line 19, after "causes", please delete "a".

Column 5, line 23, after "to", please delete "the".

Column 8, line 52, after "be", please delete "make", and insert --made-- therefore.

Column 9, line 65, after "member", please insert --is--.

Column 10, line 43, after "driver", please delete "a" and insert --as-- therefor.

Signed and Sealed this

Twenty-fourth Day of February, 1998

Attest:

BRUCE LEHMAN

*Attesting Officer* *Commissioner of Patents and Trademarks*